US012575254B2

(12) United States Patent (10) Patent No.: US 12,575,254 B2
Utsumi et al. (45) Date of Patent: Mar. 10, 2026

(54) DISPLAY DEVICE WITH UNDERCOAT LAYER IN CONTACT WITH ELECTRON TRANSPORT LAYER AND METHOD OF MANUFACTURING DISPLAY DEVICE

(71) Applicant: SHARP KABUSHIKI KAISHA, Sakai City (JP)

(72) Inventors: Hisayuki Utsumi, Sakai City (JP); Masayuki Kanehiro, Sakai City (JP); Yohei Nakanishi, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 736 days.

(21) Appl. No.: 17/799,903

(22) PCT Filed: Feb. 28, 2020

(86) PCT No.: PCT/JP2020/008490
§ 371 (c)(1),
(2) Date: Aug. 15, 2022

(87) PCT Pub. No.: WO2021/171604
PCT Pub. Date: Sep. 2, 2021

(65) Prior Publication Data
US 2023/0094724 A1 Mar. 30, 2023

(51) Int. Cl.
*H10K 50/16* (2023.01)
*H10K 59/35* (2023.01)
(Continued)

(52) U.S. Cl.
CPC ............. *H10K 50/16* (2023.02); *H10K 59/35* (2023.02); *H10K 85/111* (2023.02);
(Continued)

(58) Field of Classification Search
CPC ......... H10K 50/16; H10K 59/35; H10K 71/00
(Continued)

(56) References Cited

U.S. PATENT DOCUMENTS

| 2007/0219375 A1* | 9/2007 | Fujiyama ............. G03G 5/0655 |
| | | 546/268.1 |
| 2010/0283045 A1* | 11/2010 | Uchida .................. B82Y 20/00 |
| | | 977/773 |

(Continued)

FOREIGN PATENT DOCUMENTS

JP 2015-128191 A 7/2015

*Primary Examiner* — Xia L Cross
(74) *Attorney, Agent, or Firm* — ScienBiziP, P.C.

(57) ABSTRACT
A display device has a display area in which there is provided a plurality of pixels and a frame area surrounding the display area. The display device includes, in the display area; a substrate; a thin film transistor layer; a light-emitting element layer including a plurality of light-emitting elements configured to emit light of mutually different colors; and a sealing layer in this order. The plurality of light-emitting elements include a cathode, an electron transport layer, a light-emitting layer, a hole transport layer, and an anode in this order from a substrate side. The electron transport layer includes oxide nanoparticles and a binder resin. On an electron transport layer side of the cathode, there is provided an undercoat layer in contact with the electron transport layer.

20 Claims, 5 Drawing Sheets

(51) Int. Cl.

| | |
|---|---|
| *H10K 85/10* | (2023.01) |
| *H10K 59/12* | (2023.01) |
| *H10K 59/80* | (2023.01) |
| *H10K 102/00* | (2023.01) |

(52) U.S. Cl.
CPC ....... *H10K 85/141* (2023.02); *H10K 59/1201* (2023.02); *H10K 59/80523* (2023.02); *H10K 59/8731* (2023.02); *H10K 2102/331* (2023.02)

(58) Field of Classification Search
USPC ........................................................ 257/40
See application file for complete search history.

(56) References Cited

U.S. PATENT DOCUMENTS

| | | | |
|---|---|---|---|
| 2013/0200360 A1 | 8/2013 | Oikawa | |
| 2015/0236075 A1* | 8/2015 | Jeong ................... | H10K 50/166 |
| | | | 257/40 |
| 2021/0043864 A1* | 2/2021 | Li ......................... | H10K 50/171 |
| 2021/0408076 A1* | 12/2021 | Bao ...................... | H10D 86/443 |
| 2021/0408493 A1* | 12/2021 | Shen .................... | H10K 50/844 |
| 2022/0293712 A1* | 9/2022 | Park ..................... | H10K 59/131 |

* cited by examiner

DISPLAY DEVICE WITH UNDERCOAT LAYER IN CONTACT WITH ELECTRON TRANSPORT LAYER AND METHOD OF MANUFACTURING DISPLAY DEVICE

TECHNICAL FIELD

The present disclosure relates to display devices and methods of manufacturing a display device.

BACKGROUND ART

Various display devices have been developed that include light-emitting elements. Particularly, those display devices which include OLEDs (organic light-emitting diodes), inorganic light-emitting diodes, or QLEDs (quantum-dot light-emitting diodes) are attracting great attention because of their feasibility for low power consumption, small thickness, and high image quality.

A light-emitting element in such a display device includes: an anode; a cathode; and a functional layer, including a light-emitting layer, between the anode and the cathode.

For instance, Patent Literature 1 below describes, as a functional layer, an electron transport layer provided between a light-emitting layer and a cathode and the use of nanoparticles as the electron transport layer.

CITATION LIST

Patent Literature

Patent Literature 1: Japanese Unexamined Patent Application Publication, Tokukai, No. 2015-128191 (Publication Date: Jul. 9, 2015)

SUMMARY OF INVENTION

Technical Problem

However, this known display device can develop a problem of insufficient display capability, for example, when the light-emitting layer is formed by dropwise dispensing.

The present disclosure, in an aspect thereof, has been made in view of this problem and has an object to provide a display device with excellent display capability even when the light-emitting layer is formed by dropwise dispensing and also to provide a method of manufacturing such a display device.

Solution to Problem

A display device in accordance with the disclosure, to address the problem, has: a display area in which there is provided a plurality of pixels; and a frame area surrounding the display area, the display device including, in the display area: a substrate; a thin film transistor layer; a light-emitting element layer including a plurality of light-emitting elements configured to emit light of mutually different colors; and a sealing layer in this order, wherein the plurality of light-emitting elements include a cathode, an electron transport layer, a light-emitting layer, a hole transport layer, and an anode in this order from a substrate side, either one of the cathode and the anode is an insular electrode provided for each of the plurality of light-emitting elements, and another one of the cathode and the anode is a common electrode common to the plurality of light-emitting elements, the electron transport layer includes oxide nanoparticles and a binder resin, and on an electron transport layer side of the cathode, there is provided an undercoat layer in contact with the electron transport layer.

A method of manufacturing a display device in accordance with the disclosure, to address the problem, includes: the cathode forming step of forming a cathode on a substrate including a thin film transistor layer; the electron transport layer forming step of forming an electron transport layer on the cathode; the light-emitting layer forming step of forming a light-emitting layer on the electron transport layer; the hole transport layer forming step of forming a hole transport layer on the light-emitting layer; and the anode forming step of forming an anode on the hole transport layer, wherein between the cathode forming step and the electron transport layer forming step, the undercoat layer forming step of forming an undercoat layer on the cathode is included, and in the electron transport layer forming step, the electron transport layer including oxide nanoparticles and a binder resin is formed in contact with the undercoat layer.

Advantageous Effects of Disclosure

The present disclosure, in an aspect thereof, can provide a display device with excellent display capability even when the light-emitting layer is formed by dropwise dispensing and can also provide a method of manufacturing such a display device.

DESCRIPTION OF EMBODIMENTS

Figure 1:
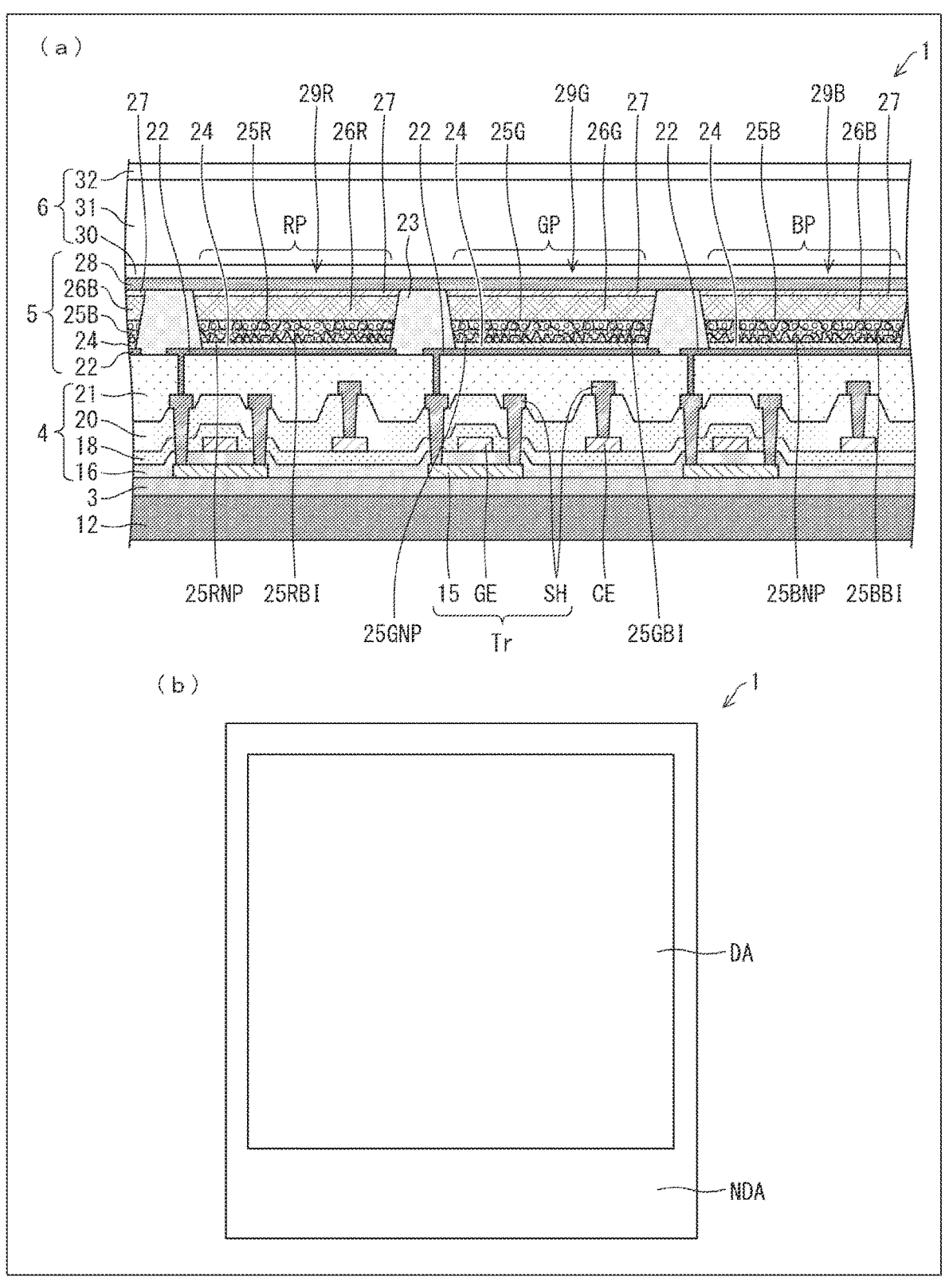
In FIG. 1, (a) is a schematic diagram of a structure of a display device in accordance with Embodiment 1, and (b) is a plan view of the display device in accordance with Embodiment 1.

The following will describe embodiments of the present disclosure with reference to FIGS. 1 to 5. Throughout the following, members of an embodiment that have the same arrangement and function as members of a specific embodiment are indicated by the same reference numerals and description thereof may be omitted for convenience of description.

Embodiment 1

Portion (a) of FIG. 1 is a schematic diagram showing a structure of a display device 1, and (b) of FIG. 1 is a plan view of the display device 1.

As shown in (b) of FIG. 1, the display device 1 has: a display area DA including a plurality of pixels RP, GP, BP; and a frame area NDA surrounding the display area DA.

As shown in (a) and (b) of FIG. 1, the display device 1 includes a substrate 12, a barrier layer 3, a thin film transistor layer 4, a light-emitting element layer 5 including a plurality of light-emitting elements 29R, 29G, 29B for emitting light of mutually different colors, and a sealing layer 6, all of which are provided in the display area DA of the display device 1 in this order.

The red pixel (first pixel) RP in the display device 1 includes the light-emitting element 29R, which is a red light-emitting element. The green pixel (second pixel) GP in the display device 1 includes the light-emitting element 29G, which is a green light-emitting element. The blue pixel (third pixel) BP in the display device 1 includes the light-emitting element 29B, which is a blue light-emitting element.

As shown in (a) of FIG. 1, the light-emitting element 29R, which is a red light-emitting element, includes a cathode 22, an electron transport layer 25R, a light-emitting layer 26R, and an anode 28 in this order from the substrate 12 side. The light-emitting element 29G, which is a green light-emitting element, includes a cathode 22, an electron transport layer 25G, a light-emitting layer 26G, and an anode 28 in this order from the substrate 12 side. The light-emitting element 29B, which is a blue light-emitting element, includes a cathode 22, an electron transport layer 25B, a light-emitting layer 26B, and an anode 28 in this order from the substrate 12 side.

Note that one of the cathode 22 and the anode 28 included in each of the light-emitting elements 29R, 29G, 29B is an insular electrode in that light-emitting element 29R, 29G, 29B, whereas the other is a common electrode that is common to the light-emitting elements 29R, 29G, 29B. The present embodiment discusses an example where the cathode 22 is an insular electrode provided in each of the light-emitting elements 29R, 29G, 29B, and the anode 28 is a common electrode common to the light-emitting elements 29R, 29G, 29B, which does not at all limit the disclosure. For instance, the anode 28 may be an insular electrode provided in each of the light-emitting elements 29R, 29G, 29B, and the cathode 22 may be a common electrode common to the light-emitting elements 29R, 29G, 29B.

Each of the light-emitting elements 29R, 29G, 29B shown in (a) of FIG. 1 is a light-emitting element with an inverted structure and includes the cathode 22, the electron transport layer 25R, 25G, 25B, the light-emitting layer 26R, 26G, 26B, a hole transport layer 27, and the anode 28 in this order. In other words, the light-emitting element 29R, 29G, 29B can be manufactured by first forming the cathode 22 and thereafter forming the electron transport layer 25R, 25G, 25B, the light-emitting layer 26R, 26G, 26B, the hole transport layer 27, and the anode 28 in this order.

Each of the light-emitting elements 29R, 29G, 29B shown in (a) of FIG. 1 includes an undercoat layer 24 in contact with the electron transport layer 25R, 25G, 25B on the electron transport layer 25R, 25G, 25B side of the cathode 22. In other words, the light-emitting element 29R includes the undercoat layer 24 in contact with the cathode 22 and the electron transport layer 25R between the cathode 22 and the electron transport layer 25R, the light-emitting element 29G includes the undercoat layer 24 in contact with the cathode 22 and the electron transport layer 25G between the cathode 22 and the electron transport layer 25G, and the light-emitting element 29B includes the undercoat layer 24 in contact with the cathode 22 and the electron transport layer 25B between the cathode 22 and the electron transport layer 25B.

In the present embodiment, since the display device 1 is a flexible display device, for example, a polyimide resin, an epoxy resin, or a polyamide resin is used as the substrate 12, which does not at all limit the disclosure. For instance, if the display device 1 is a non-flexible display device, for example, a glass substrate may be used as the substrate 12.

The barrier layer 3 prevents water and impurities from reaching a transistor Tr and the light-emitting element layer 5. The barrier layer 3 may include, for example, a silicon oxide film, a silicon nitride film, a silicon oxynitride film, or a stack of these films. These films can be formed by CVD. Note that the light-emitting element layer 5 includes the plurality of light-emitting elements 29R, 29G, 29B that emit light of mutually different colors.

The transistor Tr and a capacitive element are provided in an upper layer of the substrate 12 and the barrier layer 3. The thin film transistor layer 4 including the transistor Tr and the capacitive element includes: a semiconductor film 15; an inorganic insulation film (gate insulation film) 16 that is an upper layer of the semiconductor film 15; a gate electrode GE that is an upper layer of the inorganic insulation film 16; an inorganic insulation film (first insulation film) 18 that is an upper layer of the gate electrode GE; an opposite electrode CE of a capacitive element that is an upper layer of the inorganic insulation film 18; an inorganic insulation film (second insulation film) 20 that is an upper layer of the opposite electrode CE of the capacitive element; a layer SH forming a source electrode, a drain electrode, and wiring therefor that is an upper layer of the inorganic insulation film 20; and an interlayer insulation film 21 that is an upper layer of the layer SH forming the source electrode, the drain electrode, and the wiring therefor.

The transistor (thin film transistor (TFT)) Tr includes the semiconductor film 15, the inorganic insulation film 16, the gate electrode GE, the inorganic insulation film 18, the inorganic insulation film 20, a source electrode, and a drain electrode.

The semiconductor film 15 is made of, for example, low-temperature polysilicon (LTPS) or oxide semiconductor.

The gate electrode GE, the opposite electrode CE of the capacitive element, and the layer SH forming the source electrode, the drain electrode, and the wiring therefor include, for example, a monolayer or multilayer film of at least one of metals of aluminum (Al), tungsten (W), molybdenum (Mo), tantalum (Ta), chromium (Cr), titanium (Ti), copper (Cu), and silver (Ag).

The inorganic insulation films 16, 18, 20 may be made of, for example, a CVD-formed film of silicon oxide (SiOx), silicon nitride (SiNx), or silicon oxynitride, or a stack of these films.

The interlayer insulation film 21 is made of, for example, a photosensitive organic material, such as a polyimide resin or an acrylic resin, that can be provided by printing or coating technology.

Note that on the interlayer insulation film 21, an edge cover (bank) 23 is formed covering the edges of the plurality of cathodes 22. The edge cover 23 may be made of, for example, a photosensitive organic material, such as a polyimide resin or an acrylic resin, that can be provided by printing or coating technology.

The cathode 22 may include: a conductive, first metal oxide layer; a metal layer that reflects visible light; and a conductive, second metal oxide layer transmissive to visible light in this order. In other words, the first metal oxide layer is the bottom layer of the cathode 22 (the layer in contact with the interlayer insulation film 21), the second metal oxide layer is the top layer of the cathode 22 (the layer in contact with the undercoat layer 24), and the metal layer is an intermediate layer. The first metal oxide layer and the second metal oxide layer may be metal oxide layers selected from indium tin oxide (ITO) and indium zinc oxide (IZO). The metal layer may contain silver (Ag) or aluminum (Al). The present embodiment discusses an example where a reflective electrode with a three-layered structure (ITO/Ag/ITO) is formed as the cathode 22 by using indium tin oxide as the first metal oxide layer and the second metal oxide layer and using silver as the metal layer, which does not at all limit the disclosure. For instance, a reflective electrode with a three-layered structure (IZO/Al/IZO) may be formed as the cathode 22 by using indium zinc oxide as the first metal oxide layer and the second metal oxide layer and using aluminum as the metal layer. Furthermore, the cathode 22 may include a monolayer or multilayer metal film.

Since, the present embodiment discusses an example where the cathode 22 is a reflective electrode that reflects visible light as described above, the anode 28, disposed at least facing the cathode 22, is a transmissive electrode transmissive to visible light and may be made of a transparent conductive member that can serve as an anode of a light-emitting element. For instance, MgAg or $MoO_3$ may be used, which does not at all limit the disclosure. The cathode 22 may be a transmissive electrode, and the anode 28 may be a reflective electrode.

As shown in (a) of FIG. 1, the cathode 22 is provided for each of the plurality of pixels RP, GP, BP and electrically connected to the drain electrode of the transistor Tr. In addition, the anode 28 is provided common to all the plurality of pixels RP, GP, BP. Additionally, the transistor Tr is driven for each of the plurality of pixels RP, GP, BP.

As shown in (a) of FIG. 1, the undercoat layer 24 is formed in contact with the cathode 22 and each of the electron transport layers 25R, 25G, 25B between the cathode 22 and each of the electron transport layers 25R, 25G, 25B to improve binding (adherence) between the cathode 22 and each of the electron transport layers 25R, 25G, 25B via the undercoat layer 24.

In the present embodiment, a composition of the undercoat layer 24 is selected taking into account improvement of binding between the undercoat layer 24 and the cathode 22 and improvement of binding between the undercoat layer 24 and binder resins 25RBI, 25GBI, 25BBI (detailed later) in the electron transport layers 25R, 25G, 25B, which does not at all limit the disclosure. For instance, the composition of the undercoat layer 24 may be selected taking into account only improvement of binding between the undercoat layer 24 and the cathode 22. This is because the presence of these binder resins 25RBI, 25GBI, 25BBI alone can improve binding between the undercoat layer 24 and the electron transport layers 25R, 25G, 25B owing to the electron transport layers 25R, 25G, 25B containing the binder resins 25RBI, 25GBI, 25BBI respectively.

The undercoat layer 24 is preferably composed of any of polyethylene terephthalate, bisphenol-based resin, polyetherimide, polyvinyl alcohol, and polysiloxane.

In addition, since the undercoat layer 24 is provided between the cathode 22 and each of the electron transport layers 25R, 25G, 25B, the undercoat layer 24 has a thickness of preferably from 5 nm to 30 nm, both inclusive, and more preferably from 10 nm to 20 nm, both inclusive, when electron transportability is taken into account.

In the present embodiment, since the top layer of the cathode 22 (the layer in contact with the undercoat layer 24) is indium tin oxide, more specifically, the binder resins 25RBI, 25GBI, 25BBI in the electron transport layers 25R, 25G, 25B are polyvinylpyrrolidone, which is an organic material, as will be described later, the undercoat layer 24 is formed of a polymer material containing polyethylene terephthalate in view of binding with these materials, which does not at all limit the disclosure.

Note that in the present embodiment, a prescribed molecular weight of polyethylene terephthalate, for example, a polyethylene terephthalate resin, is mixed with a medium to prepare a coating solution that has a prescribed viscosity. This coating solution is then applied by, for example, spin-coating to coat the cathode 22 with a prescribed molecular weight of polyethylene terephthalate. Thereafter, the coated cathode 22 is subjected to a thermal process to remove the medium, so that the undercoat layer 24 can be formed of polyethylene terephthalate with a thickness of approximately 10 nm. The present embodiment discusses an example of using spin-coating, which does not at all limit the disclosure. For instance, the undercoat layer 24 may be formed by slit-coating or by an inkjet technique, so long as a prescribed preferred thickness is obtained.

In (a) of FIG. 1, the electron transport layer 25R contains oxide nanoparticles 25RNP and the binder resin 25RBI, the electron transport layer 25G contains oxide nanoparticles 25GNP and the binder resin 25GBI, and the electron transport layer 25B contains oxide nanoparticles 25BNP and the binder resin 25BBI.

In the present embodiment, the electron transport layer (first electron transport layer) 25R in the light-emitting element 29R, which is a red light-emitting element, contains zinc oxide nanoparticles as the oxide nanoparticles 25RNP and contains polyvinylpyrrolidone as the binder resin 25RBI. In addition, the electron transport layer (second electron transport layer) 25G in the light-emitting element 29G, which is a green light-emitting element, contains magnesium zinc oxide nanoparticles as the oxide nanoparticles 25GNP and contains polyvinylpyrrolidone as the binder resin 25GBI. Additionally, the electron transport layer (third electron transport layer) 25B in the light-emitting element 29B, which is a blue light-emitting element, contains lithium zinc oxide nanoparticles as the oxide nanoparticles 25BNP and contains polyvinylpyrrolidone as the binder resin 25BBI.

Note that the polyvinylpyrrolidone contained in the electron transport layers 25R, 25G, 25B as the binder resins 25RBI, 25GBI, 25BBI respectively may have any molecular weight. For example, the average molecular weight may be in the range of 10,000 to 360,000. Although the molecular weights of the binder resins 25RBI, 25GBI, 25BBI are not limited in any particular manner as described above, the molecular weights of the binder resins 25RBI, 25GBI, 25BBI may be preferably determined taking into account binding with the undercoat layer 24 and erosion or dissolution in a solution prepared by dispersing, in a medium, quantum dots (nanoparticles) used in forming the light-emitting layers 26R, 26G, 26B (detailed later).

Note that in the present embodiment, the solution prepared by dispersing, in a medium, quantum dots (nanoparticles) used in forming the light-emitting layers 26R, 26G, 26B (detailed later) contains, for example, octane, hexane, octadecene, or cyclododecene as the medium. These mediums are straight-chain compounds, aprotic, and poor in polarity. Therefore, polyvinylpyrrolidone, which does not dissolve in these mediums, is used as the binder resins

25RBI, 25GBI, 25BBI in the present embodiment, which does not at all limit the disclosure. For example, as in Embodiment 2 (detailed later), alkyl acetalized polyvinyl alcohol may be used as the binder resin.

As described in the foregoing, the present embodiment discusses an example where the electron transport layer 25R, the electron transport layer 25G, and the electron transport layer 25B each contain completely different types of oxide nanoparticles and are made of different materials, which does not at all limit the disclosure. The electron transport layer 25R, the electron transport layer 25G, and the electron transport layer 25B may each contain oxide nanoparticles that differ only in the composition ratio and be made of different materials. For instance, the electron transport layer 25R, the electron transport layer 25G, and the electron transport layer 25B may each contain, as the oxide nanoparticles 25RNP, 25GNP, 25BNP, nanoparticles of magnesium zinc oxide ($Mg_xZn_{1-x}O$ where x is a real number from 0, inclusive, to 1, exclusive) with a different composition ratio of magnesium and zinc. In addition, for example, x may have a larger value in the nanoparticles of the magnesium zinc oxide ($Mg_xZn_{1-x}O$ where x is a real number from 0, inclusive, to 1, exclusive) contained in the electron transport layer 25G than in the nanoparticles of the magnesium zinc oxide ($Mg_xZn_{1-x}O$ where x is a real number from 0, inclusive, to 1, exclusive) contained in the electron transport layer 25R and a larger value in the nanoparticles of the magnesium zinc oxide ($Mg_xZn_{1-x}O$ where x is a real number from 0, inclusive, to 1, exclusive) contained in the electron transport layer 25B than in the nanoparticles of the magnesium zinc oxide ($Mg_xZn_{1-x}O$ where x is a real number from 0, inclusive, to 1, exclusive) contained in the electron transport layer 25G. Furthermore, x may have a value from 0, inclusive, to 0.1, exclusive, in the nanoparticles of the magnesium zinc oxide ($Mg_xZn_{1-x}O$ where x is a real number from 0, inclusive, to 1, exclusive) contained in the electron transport layer 25R, a value from 0.1, inclusive, to 0.3, exclusive, in the nanoparticles of the magnesium zinc oxide ($Mg_xZn_{1-x}O$ where x is a real number from 0, inclusive, to 1, exclusive) contained in the electron transport layer 25G, and a value from 0.3 to 0.5, both inclusive, in the nanoparticles of the magnesium zinc oxide ($Mg_xZn_{1-x}O$ where x is a real number from 0, inclusive, to 1, exclusive) contained in the electron transport layer 25B.

In addition, the electron transport layer 25R, the electron transport layer 25G, and the electron transport layer 25B may contain oxide nanoparticles of the same type, but differing in the particle diameter, so as to be made of mutually different materials. For instance, the electron transport layer 25R, the electron transport layer 25G, and the electron transport layer 25B each contain, as the oxide nanoparticles 25RNP, 25GNP, 25BNP, zinc oxide nanoparticles of a different particle diameter than the others such that the zinc oxide nanoparticles have a larger particle diameter in the electron transport layer 25R than in the electron transport layer 25G and a larger particle diameter in the electron transport layer 25G than in the electron transport layer 25B. Furthermore, the zinc oxide nanoparticles have a particle diameter from 12 nm, excluding, to 20 nm, inclusive, in the electron transport layer 25R, a particle diameter from 5 nm, exclusive, to 12 nm, inclusive, in the electron transport layer 25G, and a particle diameter from 1.5 nm to 5 nm, both inclusive, in the electron transport layer 25B.

The present embodiment discusses an example where the electron transport layer 25R, the electron transport layer 25G, and the electron transport layer 25B each contain completely different types of oxide nanoparticles, so that the electron transport layer 25R, the electron transport layer 25G, and the electron transport layer 25B are made of mutually different materials and where the electron transport layer 25R, the electron transport layer 25G, and the electron transport layer 25B have the same thickness, which does not at all limit the disclosure. For instance, at least one of the electron transport layer 25R, the electron transport layer 25G, and the electron transport layer 25B may have a different thickness than the others. In addition, the electron transport layer 25R, the electron transport layer 25G, and the electron transport layer 25B may have mutually different thicknesses. For instance, the electron transport layer 25R may have a larger thickness than the electron transport layer 25G, and the electron transport layer 25G may have a larger thickness than the electron transport layer 25B.

Furthermore, either the electron transport layer 25R, the electron transport layer 25G, and the electron transport layer 25B may have the same thickness or at least one of the electron transport layer 25R, the electron transport layer 25G, and the electron transport layer 25B may have a different thickness than the others, in a case where the electron transport layer 25R, the electron transport layer 25G, and the electron transport layer 25B contain oxide nanoparticles that differ only in the composition ratio such that the electron transport layer 25R, the electron transport layer 25G, and the electron transport layer 25B are made of mutually different materials, in a case where the electron transport layer 25R, the electron transport layer 25G, and the electron transport layer 25B contain oxide nanoparticles of the same type, but differing in the particle diameter, so as to be made of mutually different materials, and in a case where the electron transport layer 25R, the electron transport layer 25G, and the electron transport layer 25B are made of the same material. In addition, the electron transport layer 25R, the electron transport layer 25G, and the electron transport layer 25B may have mutually different thicknesses. For instance, the electron transport layer 25R may have a larger thickness than the electron transport layer 25G, and the electron transport layer 25G may have a larger thickness than the electron transport layer 25B.

The present embodiment discusses an example where the light-emitting elements 29R, 29G, 29B are all QLEDs (quantum-dot light-emitting diodes), which does not at all limit the disclosure. The light-emitting elements 29R, 29G, 29B may be, for example, OLEDs (organic light-emitting diodes) or inorganic light-emitting diodes if a medium is used in the step of forming the light-emitting layers 26R, 26G, 26B in the light-emitting elements 29R, 29G, 29B (in other words, if the light-emitting layers 26R, 26G, 26B are formed by dropwise dispensing).

The light-emitting layer 26R, the light-emitting layer 26G, and the light-emitting layer 26B shown in (a) of FIG. 1 are light-emitting layers containing quantum-dot (nanoparticle) fluorescent material. The quantum-dot (nanoparticle) fluorescent material will be simply referred to as "quantum dots (nanoparticles)" with "fluorescent material" being omitted for the purpose of simplicity throughout the following description. The specific material for the quantum dots (nanoparticles) may be, for example, any of CdSe/CdS, CdSe/ZnS, InP/ZnS, and CIGS/ZnS, and these quantum dots (nanoparticles) may have a particle diameter of approximately 3 to 10 nm. Note that in each of the light-emitting layer 26R, the light-emitting layer 26G, and the light-emitting layer 26B, the quantum dots (nanoparticles) may have a different particle diameter or may be of a different type from the others such that the light-emitting layer 26R, the light-emitting layer 26G, and the light-emitting layer 26B each emit light that has a different central wavelength than the others.

Note that in the present embodiment, the solution prepared by dispersing in a medium the quantum dots (nanoparticles) used in forming the light-emitting layers 26R, 26G, 26B contains, as a medium, for example, octane, hexane, octadecene, or cyclododecene.

The sealing layer 6 shown in (a) of FIG. 1 is transparent and includes: a first inorganic sealing film 30 covering the anode 28; an organic sealing film 31 formed on an upper side of the first inorganic sealing film 30; and a second inorganic sealing film 32 covering the organic sealing film 31. The sealing layer 6, covering the light-emitting element layer 5, prevents foreign materials such as water and oxygen from reaching the light-emitting element layer 5.

The first inorganic sealing film 30 and the second inorganic sealing film 32 may be made of a silicon oxide film, a silicon nitride film, a silicon oxynitride film, or a stack of these films. These films are formed by, for example, CVD. The organic sealing film 31 is an organic transparent film thicker than the first inorganic sealing film 30 and the second inorganic sealing film 32 and may be made of a photosensitive organic material, such as a polyimide resin or an acrylic resin, that can be provided by printing or coating technology.

The present embodiment has so far discussed as an example the sealing layer 6 including the organic sealing film 31 between the first inorganic sealing film 30 and the second inorganic sealing film 32 and composed of one organic film and two inorganic films, which does not at all limit the disclosure. The sealing layer 6 may be made of at least one inorganic film or at least one organic film alone and may be made of two or more inorganic films and two or more organic films.

Figure 2:
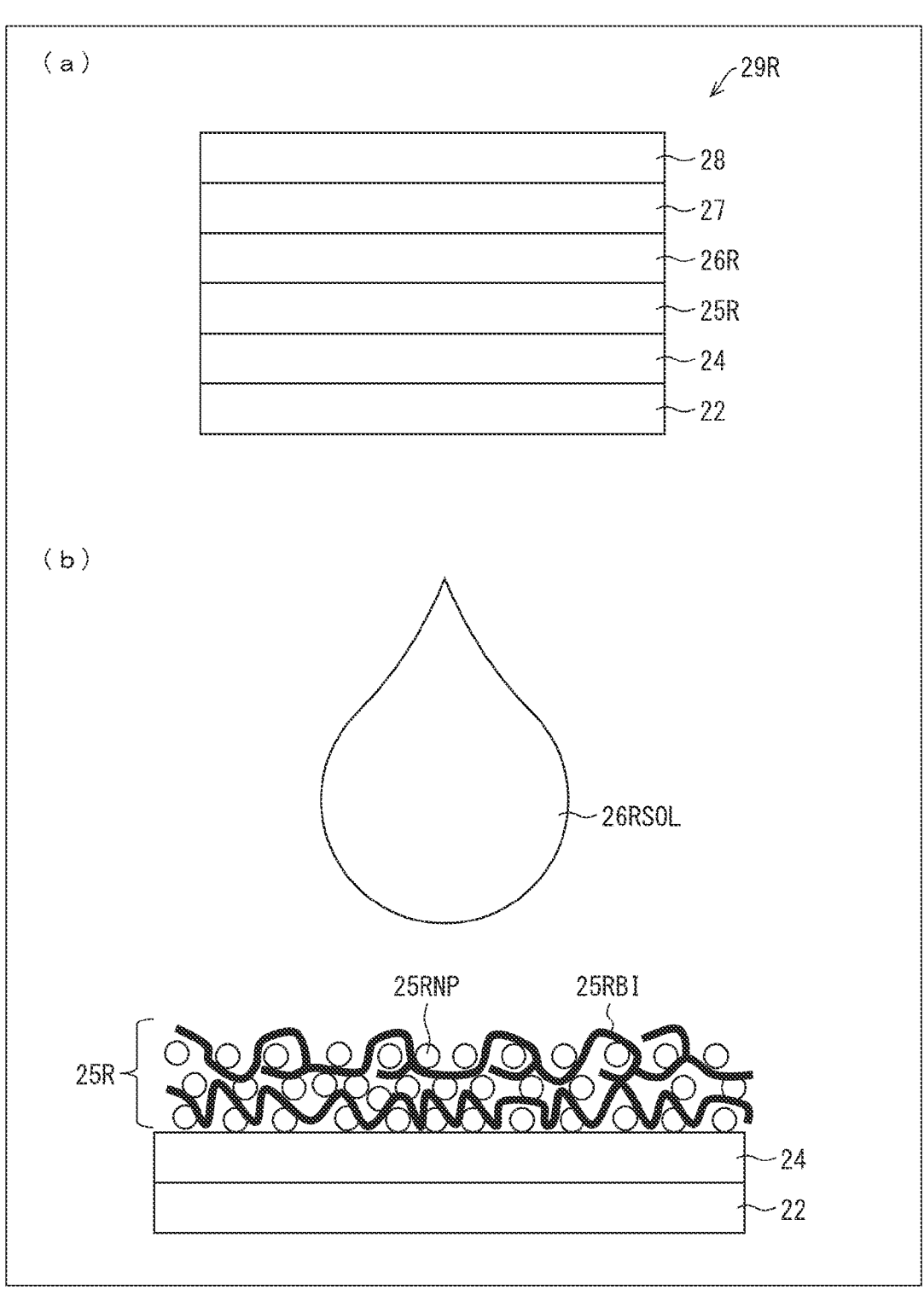
In FIG. 2. (a) and (b) are a schematic diagram illustrating a structure of a light-emitting element included in the display device in accordance with Embodiment 1 and a diagram illustrating a method of manufacturing a display device in accordance with Embodiment 1 respectively.

Portions (a) and (b) of FIG. 2 are schematic diagrams illustrating a structure of the light-emitting element 29R in the display device 1 and a method of manufacturing the display device 1. Although (a) and (b) of FIG. 2 only show the light-emitting element 29R in the display device 1, the display device 1 includes the light-emitting elements 29G and the light-emitting elements 29B as well as the light-emitting elements 29R, as shown in (a) of FIG. 1.

As shown in (a) of FIG. 1 and (a) of FIG. 2, the method of manufacturing the display device 1 includes: a cathode forming step of forming the cathode 22 on the substrate 12 including the thin film transistor layer 4; an electron transport layer forming step of forming the electron transport layers 25R, 25G, 25B on the cathode 22; a light-emitting layer forming step of forming the light-emitting layer 26R on the electron transport layer 25R, the light-emitting layer 26G on the electron transport layer 25G, and the light-emitting layer 26B on the electron transport layer 25B; a hole transport layer forming step of forming the hole transport layer 27 on the light-emitting layers 26R, 26G, 26B; and an anode forming step of forming the anode 28 on the hole transport layer 27.

Then, an undercoat layer forming step of forming the undercoat layer 24 on the cathode 22 is included between the cathode forming step and the electron transport layer forming step as shown in (b) of FIG. 2, and the electron transport layer 25R including the oxide nanoparticles 25RNP and the binder resin 25RBI is formed in contact with the undercoat layer 24 in the electron transport layer forming step as shown in (b) of FIG. 2. Note that the electron transport layer 25G including the oxide nanoparticles 25GNP and the binder resin 25GBI and the electron transport layer 25B including the oxide nanoparticles 25BNP and the binder resin 25BBI are also formed in contact with the undercoat layer 24 (not shown) similarly to the electron transport layer 25R.

In the electron transport layer forming step in accordance with the present embodiment, in the step of forming the electron transport layer (first electron transport layer) 25R included in the light-emitting element 29R, the electron transport layer 25R can be formed by dispensing dropwise a solution containing zinc oxide nanoparticles and polyvinylpyrrolidone dispersed in a medium onto a prescribed site by an inkjet technique using the edge cover (bank) 23 formed in a frame-like shape in the red pixel (first pixel) RP shown in, for example, (a) of FIG. 1 and thereafter baking the dispensed solution. In addition, in the step of forming the electron transport layer (second electron transport layer) 25G in the light-emitting element 29G, the electron transport layer 25G can be formed by dispensing dropwise a solution containing magnesium zinc oxide nanoparticles and polyvinylpyrrolidone dispersed in a medium onto a prescribed site by an inkjet technique using the edge cover (bank) 23 formed in a frame-like shape in the green pixel (second pixel) GP shown in, for example, (a) of FIG. 1 and thereafter baking the dispensed solution. Additionally, in the step of forming the electron transport layer (third electron transport layer) 25B in the light-emitting element 29B, the electron transport layer 25B can be formed by dispensing dropwise a solution containing lithium zinc oxide nanoparticles and polyvinylpyrrolidone dispersed in a medium onto a prescribed site by an inkjet technique using the edge cover (bank) 23 formed in a frame-like shape in the blue pixel (third pixel) BP shown in, for example, (a) of FIG. 1 and thereafter baking the dispensed solution.

Note that when the electron transport layer 25R, the electron transport layer 25G, and the electron transport layer 25B are made of the same material, the electron transport layer 25R, the electron transport layer 25G, and the electron transport layer 25B can be formed by, for example, a single spin-coating step and a single baking step.

In addition, as shown in (a) of FIG. 1 and (b) of FIG. 2, the light-emitting layer 26R in the light-emitting element 29R, the light-emitting layer 26G in the light-emitting element 29G, and the light-emitting layer 26B in the light-emitting element 29B are mutually different layers. In other words, the light-emitting layer 26R in the light-emitting element 29R, the light-emitting layer 26G in the light-emitting element 29G, and the light-emitting layer 26B in the light-emitting element 29B are formed in different steps using different materials.

Therefore, the light-emitting layer forming step in the method of manufacturing the display device 1 in accordance with the present embodiment includes: a step of applying a solution (first solution) 26RSOL containing red-light-emitting quantum dots (red light-emitting material) dispersed in a medium of octane, hexane, octadecene, or cyclododecene and thereafter patterning and baking the applied solution to form the light-emitting layer (red light-emitting layer) 26R; a step of applying a solution (second solution) containing green-light-emitting quantum dots (green light-emitting material) dispersed in a medium of octane, hexane, octadecene, or cyclododecene and thereafter patterning and baking the applied solution to form the light-emitting layer (green light-emitting layer) 26G; and a step of applying a solution (third solution) containing blue-light-emitting quantum dots (blue light-emitting material) dispersed in a medium of octane, hexane, octadecene, or cyclododecene and thereafter patterning and baking the applied solution to form the light-emitting layer (blue light-emitting layer) 26B.

Then, in the electron transport layer forming step, a resin that does not dissolve in the first solution, the second solution, and the third solution used in the light-emitting layer forming step, which is a post-process step, is preferably selected as the binder resins 25RBI, 25GBI, 25BBI.

In the present embodiment, since the mediums in the first solution, the second solution, and the third solution used in the light-emitting layer forming step are octane, hexane, octadecene, or cyclododecene, which are straight-chain compounds, aprotic, and poor in polarity, polyvinylpyrrolidone is used as the binder resins 25RBI, 25GBI, 25BBI in the electron transport layer forming step.

As described the foregoing, the present embodiment has so far discussed an example where the light-emitting layers 26R, 26G, 26B are formed by application (coating), patterning, and baking, which does not at all limit the disclosure. The light-emitting layers 26R, 26G, 26B may be formed respectively by dispensing dropwise the solution (first solution) 26RSOL, the solution (second solution), and the solution (third solution) onto a prescribed site by an inkjet technique and thereafter baking the dispensed solution.

As described in the foregoing, in the present embodiment, the step of forming the light-emitting layers 26R, 26G, 26B is performed by dropwise dispensing using medium-containing solutions, which can simplify this forming step and can in turn further simplify the step of manufacturing the display device 1.

As described in the foregoing, according to the display device 1 or the method of manufacturing the display device 1, the electron transport layers 25R, 25G, 25B including the binder resins 25RBI, 25GBI, 25BBI are formed so as to include the undercoat layer 24 and to be in contact with the undercoat layer 24. Hence, in the present embodiment, even when the light-emitting layers 26R, 26G, 26B are formed by dropwise dispensing, the undercoat layer 24 can prevent the medium used in the forming step from dissolving the oxide nanoparticles in the electron transport layers 25R, 25G, 25B. As a result of this, in the present embodiment, since the electron transport layers 25R, 25G, 25B can be prevented from not normally functioning, a display device with excellent display capability and a method of manufacturing such a display device can be provided even when the light-emitting layers 26R, 26G, 26B are formed by dropwise dispensing.

Embodiment 2

Figure 3:
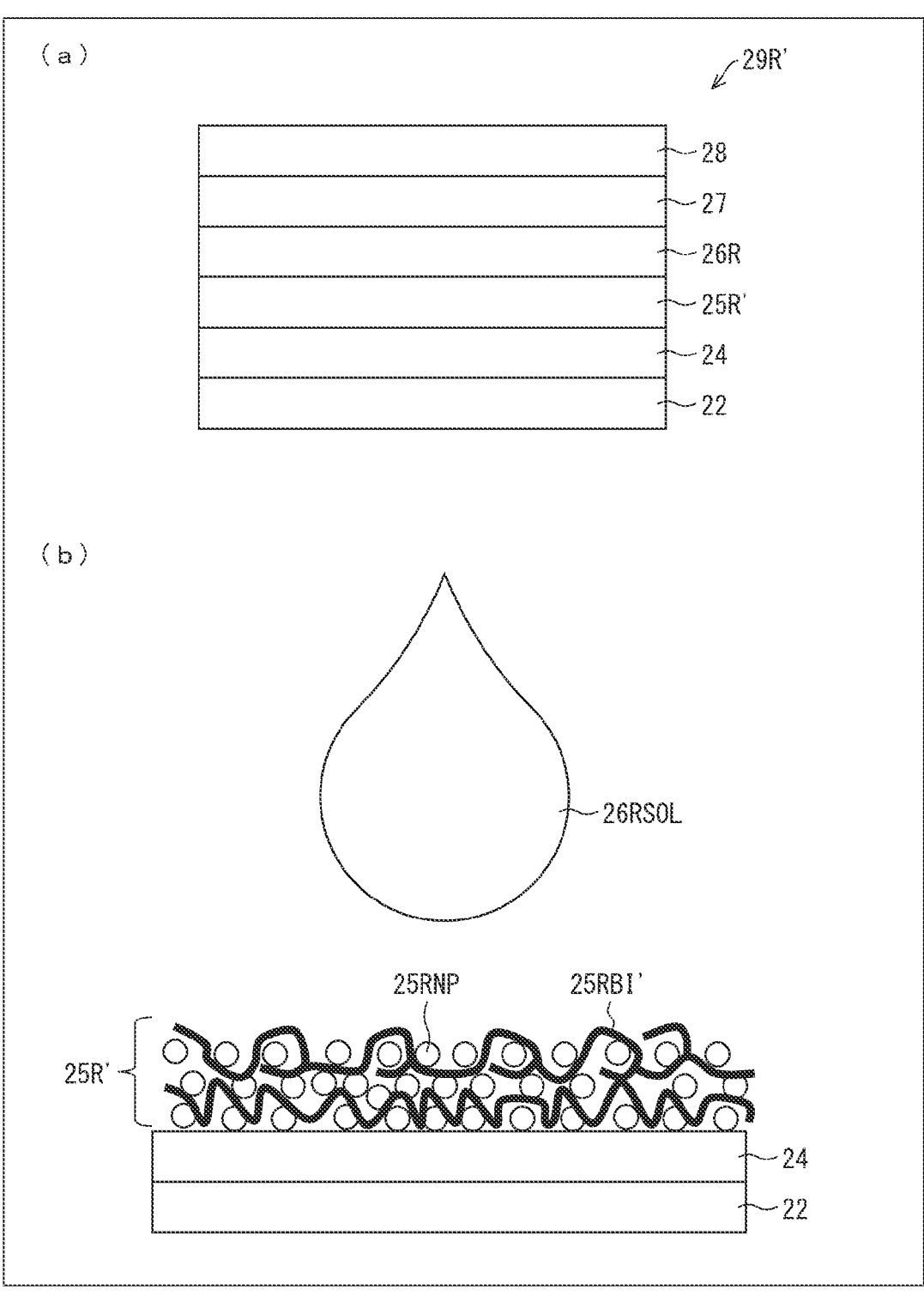
In FIG. 3, (a) and (b) are a schematic diagram illustrating a structure of a light-emitting element included in a display device in accordance with Embodiment 2 and a diagram illustrating a method of manufacturing a display device in accordance with Embodiment 2 respectively.

A description is given next of Embodiment 2 of the disclosure with reference to FIG. 3. Light-emitting elements 29R' included in a display device in accordance with the present embodiment differ from Embodiment 1 in that the light-emitting elements 29R' contain an electron transport layer 25R' containing alkyl acetalized polyvinyl alcohol as a binder resin 25RBI' and are the same in the other respects as described in Embodiment 1. For convenience of description, members of the present embodiment that have the same function as members shown in the drawings for Embodiment 1 are indicated by the same reference numerals, and description thereof is omitted.

Portions (a) and (b) of FIG. 3 are schematic diagrams illustrating a structure of the light-emitting element 29R' in the display device in accordance with Embodiment 2 and a method of manufacturing a display device in accordance with Embodiment 2.

In the present embodiment, the electron transport layer (first electron transport layer) 25R' in the light-emitting element 29R', which is a red light-emitting element shown in (a) of FIG. 3, contains zinc oxide nanoparticles as the oxide nanoparticles 25RNP and contains alkyl acetalized polyvinyl alcohol as the binder resin 25RBI'. In addition, the electron transport layer (second electron transport layer) (not shown) in the light-emitting element that is a green light-emitting element contains magnesium zinc oxide nanoparticles as the oxide nanoparticles and contains alkyl acetalized polyvinyl alcohol as a binder resin. Additionally, the electron transport layer (third electron transport layer) (not shown) in the light-emitting element that is a blue light-emitting element contains lithium zinc oxide nanoparticles as the oxide nanoparticles and contains alkyl acetalized polyvinyl alcohol as a binder resin.

Note that the alkyl acetalized polyvinyl alcohol that is a binder resin has a molecular weight that is not limited in any particular manner and may have an average molecular weight in the range of, for example, from 17,000 to 23.000. Although, as described above, the binder resin may have a molecular weight that is not limited in any particular manner, the molecular weight of the binder resin is preferably determined taking into account binding with the undercoat layer 24 and erosion or dissolution in a solution prepared by dispersing, in a medium, quantum dots (nanoparticles) used in forming the light-emitting layers 26R, 26G, 26B.

Note that in the present embodiment, the solution prepared by dispersing, in a medium, quantum dots (nanoparticles) used in forming the light-emitting layers 26R, 26G, 26B contain, as the medium, for example, octane, hexane, octadecene, or cyclododecene. These mediums are straight-chain compounds, aprotic, and poor in polarity. Therefore, in the present embodiment, alkyl acetalized polyvinyl alcohol, which does not dissolve in these mediums, is used as the binder resin.

The present embodiment has so far discussed an example where all the electron transport layers contain alkyl acetalized polyvinyl alcohol as the binder resin, which does not at all limit the disclosure. For example, only the binder resin 25RBI' contained in the electron transport layer 25R' may be alkyl acetalized polyvinyl alcohol with the binder resins contained in the other electron transport layers being polyvinylpyrrolidone, which is used in Embodiment 1 described above. Embodiment 1 described above.

As described in the foregoing, according to the display device in accordance with Embodiment 2 or the method of manufacturing a display device in accordance with Embodiment 2, an electron transport layer containing alkyl acetalized polyvinyl alcohol as a binder resin is formed so as to include the undercoat layer 24 and to be in contact with the undercoat layer 24. Hence, in the present embodiment, even when the light-emitting layers 26R, 26G, 26B are formed by dropwise dispensing, the undercoat layer 24 can prevent the medium used in the forming step from dissolving the oxide nanoparticles in the electron transport layer. As a result of this, in the present embodiment, since the electron transport layer can be prevented from not normally functioning, a display device with excellent display capability and a method of manufacturing such a display device can be provided even when the light-emitting layers 26R, 26G, 26B are formed by dropwise dispensing.

Embodiment 3

Figure 4:
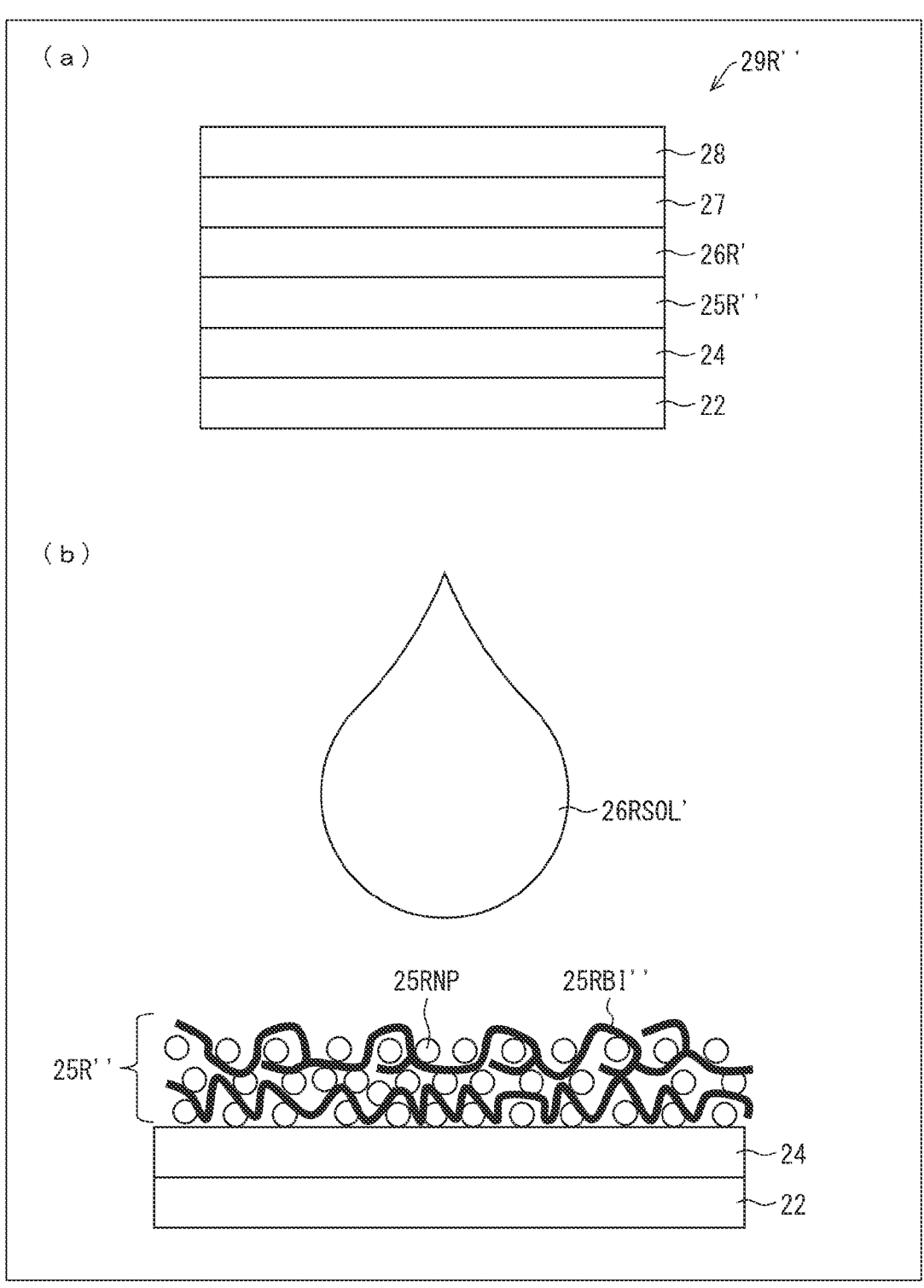
In FIG. 4, (a) and (b) are a schematic diagram illustrating a structure of a light-emitting element included in a display device in accordance with Embodiment 3 and a diagram illustrating a method of manufacturing a display device in accordance with Embodiment 3 respectively.
Figure 5:
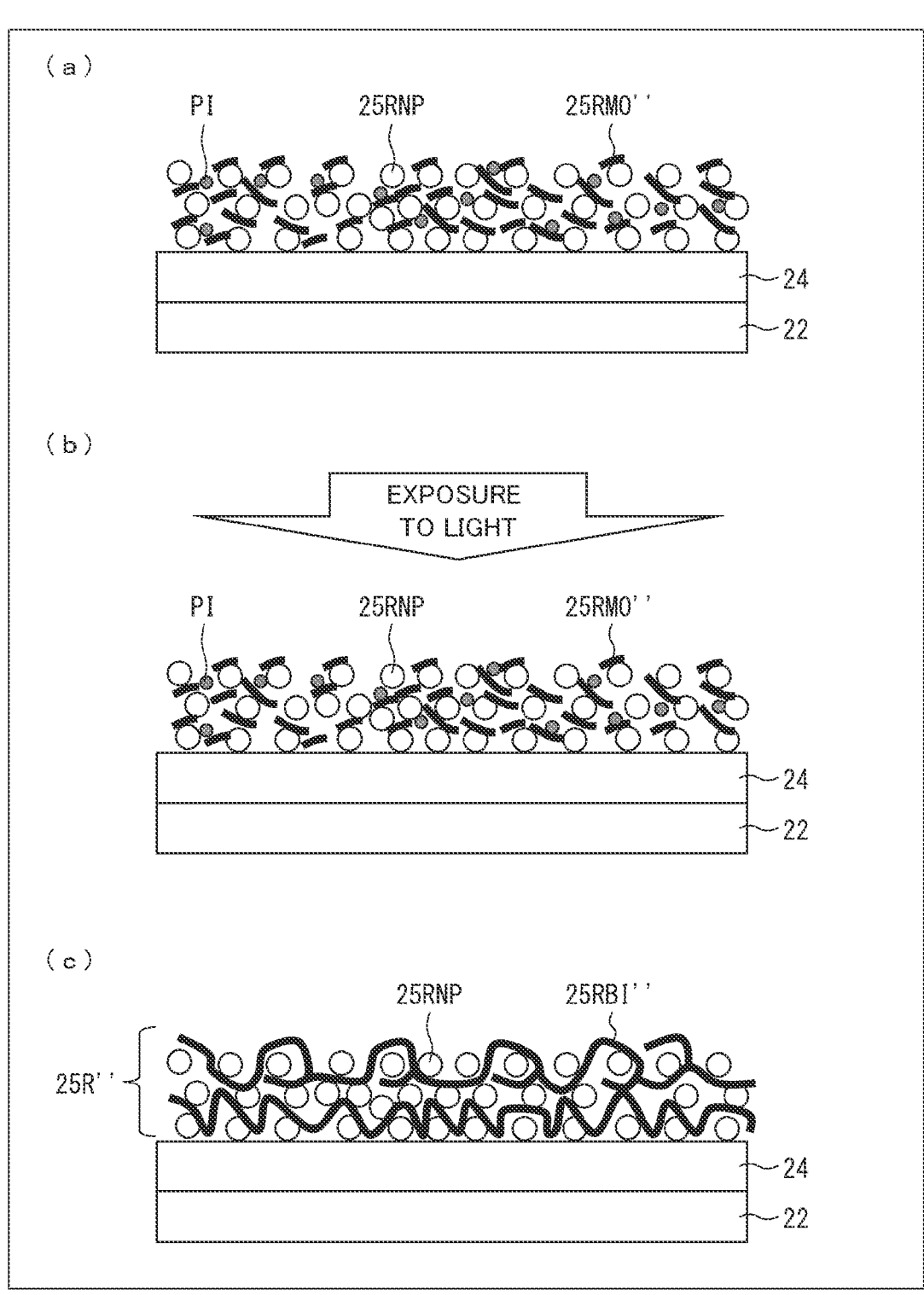
In FIG. 5, (a), (b) and (c) are diagrams illustrating a step of forming an electron transport layer in the display device in accordance with Embodiment 3.

A description is given next of Embodiment 3 of the disclosure with reference to FIGS. 4 and 5. Light-emitting elements 29R'' included in a display device in accordance with the present embodiment differ from Embodiments 1 and 2 in that the light-emitting elements 29R'' each include: a light-emitting layer (red light-emitting layer) 26R' formed by applying a solution (first solution) containing red-light-emitting quantum dots (red light-emitting material) dispersed in toluene, which is a medium, and thereafter patterning the applied solution; and an electron transport layer 25R'' containing a binder resin 25RBI'' obtained by photopolymerization of a monomer 25RMO'' and are the same in the other respects as described in Embodiments 1 and 2. For convenience of description, members of the present embodiment that have the same function as members shown in the drawings for Embodiments 1 and 2 are indicated by the same reference numerals, and description thereof is omitted.

Portions (a) and (b) of FIG. 4 are schematic diagrams illustrating a structure of the light-emitting element 29R'' in the display device in accordance with Embodiment 3 and a method of manufacturing a display device in accordance with Embodiment 3.

Portions (a), (b), and (c) of FIG. 5 are diagrams illustrating a step of forming the electron transport layer 25R'' in the display device in accordance with Embodiment 3.

As shown in (a) and (b) of FIG. 4, a light-emitting layer forming step in the method of manufacturing a display device in accordance with Embodiment 3 includes: a step of applying a solution (first solution) 26RSOL' containing red-light-emitting quantum dots (red light-emitting material) dispersed in toluene, which is a medium, and thereafter patterning the applied solution to form the light-emitting layer (red light-emitting layer) 26R'; a step of applying a solution (second solution) containing green-light-emitting quantum dots (green light-emitting material) dispersed in toluene, which is a medium, and thereafter patterning the applied solution to form a light-emitting layer (green light-emitting layer); and a step of applying a solution (third solution) containing blue-light-emitting quantum dots (blue light-emitting material) dispersed in toluene, which is a medium, and thereafter patterning the applied solution to form a light-emitting layer (blue light-emitting layer). Toluene is a medium that is a cyclic compound, aprotic, and intermediate in polarity.

Therefore, in the present embodiment, a binder resin that does not dissolve in a medium, such as toluene, that is a cyclic compound, aprotic, and intermediate in polarity needs to be selected as the binder resin 25RBI'' in the electron transport layer 25R''. However, such a binder resin has a relatively large molecular weight and hence makes it difficult to, for example, select a medium for dissolving the binder resin.

Accordingly, in the electron transport layer forming step in accordance with the present embodiment, as shown in (a) of FIG. 5, in the step of forming the electron transport layer (first electron transport layer) 25R'' included in the light-emitting element 29R'', which is a light-emitting element, the electron transport layer 25R'' containing zinc oxide nanoparticles as the oxide nanoparticles 25RNP and the binder resin 25RBI'' can be obtained as shown in (c) of FIG. 5, by dispensing dropwise a solution prepared by dispersing, in a medium, zinc oxide nanoparticles as the oxide nanoparticles 25RNP, N-vinyl 2-pyrrolidone as the monomer 25RMO'', and triphenyl sulfonium tetrafluoroborate as a photopolymerization initiator PI onto a prescribed site by an inkjet technique using the edge cover (bank) 23 formed in a frame-like shape in the red pixel (first pixel) RP shown in, for example, (a) of FIG. 1 and thereafter exposing to light for photopolymerization (exposure-to-light step), rinsing, and baking the dispensed solution as shown in (b) of FIG. 5. In the step of forming an electron transport layer (second electron transport layer) included in the green light-emitting element, an electron transport layer (second electron transport layer) containing magnesium zinc oxide nanoparticles as the oxide nanoparticles 25GNP and a binder resin can be obtained (not shown), by dispensing dropwise a solution prepared by dispersing, in a medium, magnesium zinc oxide nanoparticles as the oxide nanoparticles 25GNP. N-vinyl 2-pyrrolidone as the monomer 25RMO'', and triphenyl sulfonium tetrafluoroborate as a photopolymerization initiator PI onto a prescribed site by an inkjet technique using the edge cover (bank) 23 formed in a frame-like shape in the green pixel (second pixel) GP shown in, for example, (a) of FIG. 1 and thereafter exposing to light for photopolymerization (exposure-to-light step), rinsing, and baking the dispensed solution. In addition, in the step of forming an electron transport layer (third electron transport layer) included in the blue light-emitting element, an electron transport layer (third electron transport layer) containing lithium zinc oxide nanoparticles as the oxide nanoparticles 25BNP and a binder resin can be obtained (not shown), by dispensing dropwise a solution prepared by dispersing, in a medium, lithium zinc oxide nanoparticles as the oxide nanoparticles 25BNP, N-vinyl 2-pyrrolidone as the monomer 25RMO'', and triphenyl sulfonium tetrafluoroborate as a photopolymerization initiator PI onto a prescribed site by an inkjet technique using the edge cover (bank) 23 formed in a frame-like shape in the blue pixel (third pixel) BP shown in, for example, (a) of FIG. 1 and thereafter exposing to light for photopolymerization (exposure-to-light step), rinsing, and baking the dispensed solution.

Note that when the electron transport layer (first electron transport layer) 25R'' included in the light-emitting element 29R'', which is a red light-emitting element, the electron transport layer (second electron transport layer) included in the green light-emitting element, and the electron transport layer (third electron transport layer) included in the blue light-emitting element are made of the same material, these layers can be formed by, for example, a single spin-coating step, a single exposure-to-light step, a single rinsing step, and a single baking step.

As described in the foregoing, the present embodiment discusses an example where N-vinyl 2-pyrrolidone is used as the monomer 25RMO'' and triphenyl sulfonium tetrafluoroborate is used as the photopolymerization initiator PI, which does not at all limit the disclosure. For example, methyl acrylate may be used as the monomer 25RMO'', and 2,2'-azobis(2,4-dimethyl valeronitrile) may be used as the photopolymerization initiator PI.

As described in the foregoing, according to the display device in accordance with Embodiment 3 or the method of manufacturing a display device in accordance with Embodiment 3, an electron transport layer containing a binder resin obtained by photopolymerization of a monomer is formed so as to include the undercoat layer 24 and to be in contact with the undercoat layer 24. Hence, in the present embodiment, even when the light-emitting layers are formed by dropwise dispensing, the undercoat layer 24 can prevent the medium used in the forming step from dissolving the oxide nanoparticles in the electron transport layer. As a result of this, in the present embodiment, since the electron transport layer can be prevented from not normally functioning, a display device with excellent display capability and a method of manufacturing such a display device can be provided even when the light-emitting layers are formed by dropwise dispensing.

General Description

Aspect 1

A display device having: a display area in which there is provided a plurality of pixels; and a frame area surrounding the display area, the display device including, in the display area: a substrate; a thin film transistor layer; a light-emitting element layer including a plurality of light-emitting elements configured to emit light of mutually different colors; and a sealing layer in this order, wherein the plurality of light-emitting elements include a cathode, an electron transport layer, a light-emitting layer, a hole transport layer, and an anode in this order from a substrate side, either one of the cathode and the anode is an insular electrode provided for each of the plurality of light-emitting elements, and another one of the cathode and the anode is a common electrode common to the plurality of light-emitting elements, the electron transport layer includes oxide nanoparticles and a binder resin, and on an electron transport layer side of the cathode, there is provided an undercoat layer in contact with the electron transport layer.

Aspect 2

The display device of aspect 1, wherein the cathode includes: a first metal oxide layer that is conductive; a metal layer configured to reflect visible light; and a second metal oxide layer that is conductive, in this order, and the second metal oxide layer transmits visible light.

Aspect 3

The display device of aspect 2, wherein the first metal oxide layer and the second metal oxide layer are metal oxide layers selected from indium tin oxide and indium zinc oxide, and the metal layer is silver or aluminum.

Aspect 4

The display device of any one of aspects 1 to 3, wherein the undercoat layer is composed of any of polyethylene terephthalate, bisphenol-based resin, polyetherimide, polyvinyl alcohol, and polysiloxane.

Aspect 5

The display device of any one of aspects 1 to 4, wherein the plurality of light-emitting elements include: a red light-emitting element configured to emit red light; a green light-emitting element configured to emit green light; and a blue light-emitting element configured to emit blue light, and the plurality of pixels include: a first pixel including the red light-emitting element; a second pixel including the green light-emitting element; and a third pixel including the blue light-emitting element.

Aspect 6

The display device of aspect 5, wherein the red light-emitting element includes a first electron transport layer as the electron transport layer, the green light-emitting element includes a second electron transport layer as the electron transport layer, the blue light-emitting element includes a third electron transport layer as the electron transport layer, and the first electron transport layer, the second electron transport layer, and the third electron transport layer are made of mutually different materials.

Aspect 7

The display device of aspect 6, wherein the first electron transport layer includes zinc oxide nanoparticles as the oxide nanoparticles, the second electron transport layer includes magnesium zinc oxide nanoparticles as the oxide nanoparticles, and the third electron transport layer includes lithium zinc oxide nanoparticles as the oxide nanoparticles.

Aspect 8

The display device of aspect 6, wherein the first electron transport layer, the second electron transport layer, and the third electron transport layer each include zinc oxide nanoparticles of a different particle diameter as the oxide nanoparticles, the particle diameter of the zinc oxide nanoparticles in the first electron transport layer is larger than the particle diameter of the zinc oxide nanoparticles in the second electron transport layer, and the particle diameter of the zinc oxide nanoparticles in the second electron transport layer is larger than the particle diameter of the zinc oxide nanoparticles in the third electron transport layer.

Aspect 9

The display device of aspect 8, wherein the particle diameter of the zinc oxide nanoparticles in the first electron transport layer is from 12 nm, exclusive, to 20 nm, inclusive, the particle diameter of the zinc oxide nanoparticles in the second electron transport layer is from 5 nm, exclusive, to 12 nm, inclusive, and the particle diameter of the zinc oxide nanoparticles in the third electron transport layer is from 1.5 nm to 5 nm, both inclusive.

Aspect 10

The display device of aspect 6, wherein the first electron transport layer, the second electron transport layer, and the third electron transport layer each include $Mg_xZn_{1-x}O$ nanoparticles as the oxide nanoparticles, where x is a real number from 0, inclusive, to 1, exclusive, x has a larger value in the second electron transport layer than in the first electron transport layer, and x has a larger value in the third electron transport layer than in the second electron transport layer.

Aspect 11

The display device of aspect 10, wherein x has a value from 0, inclusive, to 0.1, exclusive, in the $Mg_xZn_{1-x}O$ nanoparticles in the first electron transport layer, x has a value from 0.1, inclusive, to 0.3, exclusive, in the $Mg_xZn_{1-x}O$ nanoparticles in the second electron transport layer, and x has a value from 0.3 to 0.5, both inclusive, in the $Mg_xZn_{1-x}O$ nanoparticles in the third electron transport layer.

Aspect 12

The display device of aspect 5, wherein the red light-emitting element includes a first electron transport layer as the electron transport layer, the green light-emitting element includes a second electron transport layer as the electron transport layer, the blue light-emitting element includes a third electron transport layer as the electron transport layer, and the first electron transport layer, the second electron transport layer, and the third electron transport layer have mutually different thicknesses.

Aspect 13

The display device of aspect 12, wherein the first electron transport layer, the second electron transport layer, and the third electron transport layer are made of mutually different materials.

Aspect 14

The display device of aspect 12 or 13, wherein the thickness of the first electron transport layer is larger than the thickness of the second electron transport layer, and the thickness of the second electron transport layer is larger than the thickness of the third electron transport layer.

Aspect 15

The display device of any one of aspects 1 to 14, wherein the light-emitting layer is a quantum-dot layer containing quantum dots.

Aspect 16

The display device of any one of aspects 1 to 15, wherein the binder resin is polyvinylpyrrolidone or alkyl acetalized polyvinyl alcohol.

Aspect 17

The display device of any one of aspects 1 to 16, wherein the electron transport layer includes: N-vinyl 2-pyrrolidone; and triphenyl sulfonium tetrafluoroborate as a photopolymerization initiator.

Aspect 18

The display device of any one of aspects 1 to 16, wherein the electron transport layer includes: methyl acrylate; and 2,2'-azobis(2,4-dimethyl valeronitrile) as a photopolymerization initiator.

Aspect 19

A method of manufacturing a display device, the method including: the cathode forming step of forming a cathode on a substrate including a thin film transistor layer; the electron transport layer forming step of forming an electron transport layer on the cathode; the light-emitting layer forming step of forming a light-emitting layer on the electron transport layer; the hole transport layer forming step of forming a hole transport layer on the light-emitting layer; and the anode forming step of forming an anode on the hole transport layer, wherein between the cathode forming step and the electron transport layer forming step, the undercoat layer forming step of forming an undercoat layer on the cathode is included, and in the electron transport layer forming step, the electron transport layer including oxide nanoparticles and a binder resin is formed in contact with the undercoat layer.

Additional Remarks

The present invention is not limited to the description of the embodiments above and may be altered within the scope of the claims. Embodiments based on a proper combination of technical means disclosed in different embodiments are encompassed in the technical scope of the present invention. Furthermore, new technological features can be created by combining different technical means disclosed in the embodiments.

INDUSTRIAL APPLICABILITY

The disclosure is applicable to display devices and methods of manufacturing a display device.

The invention claimed is:

1. A display device having a display area, in which a plurality of pixels is provided, and a frame area surrounding the display area, the display device comprising, in the display area:

a substrate;

a thin film transistor layer;

a light-emitting element layer including a plurality of light-emitting elements configured to emit light of mutually different colors; and a sealing layer, wherein the substrate, the thin film transistor, the light-emitting layer, and the sealing layer are provided in this stated order, wherein:

each of the plurality of light-emitting elements includes a cathode, an electron transport layer, a light-emitting layer, a hole transport layer, and an anode in this stated order from a substrate side, one of the cathode and the anode is an insular electrode provided for each of the plurality of light-emitting elements, and another one of the cathode and the anode is a common electrode common to the plurality of light-emitting elements, the electron transport layer includes oxide nanoparticles and a binder resin, on an electron transport layer side of the cathode, an undercoat layer is provided, such that the undercoat layer is in contact with the electron transport layer, the plurality of light-emitting elements includes a red light-emitting element configured to emit red light, a green light-emitting element configured to emit green light, and a blue light-emitting element configured to emit blue light, the plurality of pixels includes a first pixel including the red light-emitting element, a second pixel including the green light-emitting element, and a third pixel including the blue light-emitting element, the red light-emitting element includes a first electron transport layer as the electron transport layer, the green light-emitting element includes a second electron transport layer as the electron transport layer, the blue light-emitting element includes a third electron transport layer as the electron transport layer, the first electron transport layer, the second electron transport layer, and the third electron transport layer are made of mutually different materials, each of the first electron transport layer, the second electron transport layer, and the third electron transport layer includes zinc oxide nanoparticles of a different particle diameter as the oxide nanoparticles, a particle diameter of each zinc oxide nanoparticle in the first electron transport layer is larger than a particle diameter of each zinc oxide nanoparticle in the second electron transport layer, and the particle diameter of each zinc oxide nanoparticle in the second electron transport layer is larger than a particle diameter of each zinc oxide nanoparticle in the third electron transport layer.

2. The display device according to claim 1, wherein the cathode includes a first metal oxide layer that is conductive, a metal layer configured to reflect visible light, and a second metal oxide layer that is conductive, in this stated order, and the second metal oxide layer transmits visible light.

3. The display device according to claim 2, wherein the first metal oxide layer and the second metal oxide layer are metal oxide layers selected from indium tin oxide and indium zinc oxide, and the metal layer includes silver or aluminum.

4. The display device according to claim 1, wherein the undercoat layer is composed of any of polyethylene terephthalate, bisphenol-based resin, polyetherimide, polyvinyl alcohol, and polysiloxane.

5. The display device according to claim 1, wherein the second electron transport layer includes magnesium zinc oxide nanoparticles as the oxide nanoparticles, and the third electron transport layer includes lithium zinc oxide nanoparticles as the oxide nanoparticles.

6. The display device according to claim 1, wherein the particle diameter of each zinc oxide nanoparticle in the first electron transport layer is from 12 nm, exclusive, to 20 nm, inclusive, the particle diameter of each zinc oxide nanoparticle in the second electron transport layer is from 5 nm, exclusive, to 12 nm, inclusive, and the particle diameter of each zinc oxide nanoparticle in the third electron transport layer is from 1.5 nm to 5 nm, both inclusive.

7. The display device according to claim 1, wherein the light-emitting layer comprises a quantum-dot layer containing quantum dots.

8. The display device according to claim 1, wherein the binder resin comprises polyvinylpyrrolidone or alkyl acetalized polyvinyl alcohol.

9. The display device according to claim 1, wherein the electron transport layer includes N-vinyl 2-pyrrolidone, and triphenyl sulfonium tetrafluoroborate, as a photopolymerization initiator.

10. The display device according to claim 1, wherein the electron transport layer includes methyl acrylate, and 2,2'-azobis(2,4-dimethyl valeronitrile), as a photopolymerization initiator.

11. A display device having a display area, in which a plurality of pixels is provided, and a frame area surrounding the display area, the display device comprising, in the display area:

a substrate;

a thin film transistor layer;

a light-emitting element layer including a plurality of light-emitting elements configured to emit light of mutually different colors; and a sealing layer, wherein the substrate, the thin film transistor, the light-emitting layer, and the sealing layer are provided in this stated order, wherein:

each of the plurality of light-emitting elements includes a cathode, an electron transport layer, a light-emitting layer, a hole transport layer, and an anode in this stated order from a substrate side, one of the cathode and the anode is an insular electrode provided for each of the plurality of light-emitting elements, and another one of the cathode and the anode is a common electrode common to the plurality of light-emitting elements, the electron transport layer includes oxide nanoparticles and a binder resin, on an electron transport layer side of the cathode, an undercoat layer is provided, such that the undercoat layer is in contact with the electron transport layer, the plurality of light-emitting elements includes a red light-emitting element configured to emit red light, a green light-emitting element configured to emit green light, and a blue light-emitting element configured to emit blue light, the plurality of pixels includes a first pixel including the red light-emitting element, a second pixel including the green light-emitting element, and a third pixel including the blue light-emitting element, the red light-emitting element includes a first electron transport layer as the electron transport layer, the green light-emitting element includes a second electron transport layer as the electron transport layer, the blue light-emitting element includes a third electron transport layer as the electron transport layer, the first electron transport layer, the second electron transport layer, and the third electron transport layer are made of mutually different materials, a particle diameter of each oxide nanoparticle in the first electron transport layer is from 12 nm, exclusive, to 20 nm, inclusive, a particle diameter of each oxide nanoparticle in the second electron transport layer is from 5 nm, exclusive, to 12 nm, inclusive, and a particle diameter of each oxide nanoparticle in the third electron transport layer is from 1.5 nm to 5 nm, both inclusive.

12. The display device according to claim 11, wherein the cathode includes a first metal oxide layer that is conductive, a metal layer configured to reflect visible light, and a second metal oxide layer that is conductive, in this stated order, and the second metal oxide layer transmits visible light.

13. The display device according to claim 12, wherein the first metal oxide layer and the second metal oxide layer are metal oxide layers selected from indium tin oxide and indium zinc oxide, and the metal layer includes silver or aluminum.

14. The display device according to claim 11, wherein the undercoat layer is composed of any of polyethylene terephthalate, bisphenol-based resin, polyetherimide, polyvinyl alcohol, and polysiloxane.

15. The display device according to claim 11, wherein the first electron transport layer includes zinc oxide nanoparticles as the oxide nanoparticles, the second electron transport layer includes magnesium zinc oxide nanoparticles as the oxide nanoparticles, and the third electron transport layer includes lithium zinc oxide nanoparticles as the oxide nanoparticles.

16. A display device having a display area, in which a plurality of pixels is provided, and a frame area surrounding the display area, the display device comprising, in the display area:

a substrate;

a thin film transistor layer;

a light-emitting element layer including a plurality of light-emitting elements configured to emit light of mutually different colors; and a sealing layer, wherein the substrate, the thin film transistor, the light-emitting layer, and the sealing layer are provided in this stated order, wherein:

each of the plurality of light-emitting elements includes a cathode, an electron transport layer, a light-emitting layer, a hole transport layer, and an anode in this stated order from a substrate side, one of the cathode and the anode is an insular electrode provided for each of the plurality of light-emitting elements, and another one of the cathode and the anode is a common electrode common to the plurality of light-emitting elements, the electron transport layer includes oxide nanoparticles and a binder resin, on an electron transport layer side of the cathode, an undercoat layer is provided, such that the undercoat layer is in contact with the electron transport layer, the plurality of light-emitting elements includes a red light-emitting element configured to emit red light, a green light-emitting element configured to emit green light, and a blue light-emitting element configured to emit blue light, the plurality of pixels includes a first pixel including the red light-emitting element, a second pixel including the green light-emitting element, and a third pixel including the blue light-emitting element, the red light-emitting element includes a first electron transport layer as the electron transport layer, the green light-emitting element includes a second electron transport layer as the electron transport layer, the blue light-emitting element includes a third electron transport layer as the electron transport layer, the first electron transport layer, the second electron transport layer, and the third electron transport layer are made of mutually different materials, a thickness of the first electron transport layer is larger than a thickness of the second electron transport layer, and the thickness of the second electron transport layer is larger than a thickness of the third electron transport layer.

17. The display device according to claim 16, wherein the cathode includes a first metal oxide layer that is conductive, a metal layer configured to reflect visible light, and a second metal oxide layer that is conductive, in this stated order, and the second metal oxide layer transmits visible light.

18. The display device according to claim 17, wherein the first metal oxide layer and the second metal oxide layer are metal oxide layers selected from indium tin oxide and indium zinc oxide, and the metal layer includes silver or aluminum.

19. The display device according to claim 16, wherein the undercoat layer is composed of any of polyethylene terephthalate, bisphenol-based resin, polyetherimide, polyvinyl alcohol, and polysiloxane.

20. The display device according to claim 16, wherein the first electron transport layer includes zinc oxide nanoparticles as the oxide nanoparticles, the second electron transport layer includes magnesium zinc oxide nanoparticles as the oxide nanoparticles, and the third electron transport layer includes lithium zinc oxide nanoparticles as the oxide nanoparticles.

\* \* \* \* \*